(12) United States Patent
Hahl et al.

(10) Patent No.: US 9,638,825 B2
(45) Date of Patent: May 2, 2017

(54) METAL SENSOR

(71) Applicant: Robert Bosch GmbH, Stuttgart (DE)

(72) Inventors: Markus Hahl, Korntal-Muechingen (DE); Tobias Zibold, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 7 days.

(21) Appl. No.: 14/359,600

(22) PCT Filed: Sep. 24, 2012

(86) PCT No.: PCT/EP2012/068720
§ 371 (c)(1),
(2) Date: May 21, 2014

(87) PCT Pub. No.: WO2013/075861
PCT Pub. Date: May 30, 2013

(65) Prior Publication Data
US 2014/0300351 A1    Oct. 9, 2014

(30) Foreign Application Priority Data

Nov. 22, 2011    (DE) .......................... 10 2011 086 773

(51) Int. Cl.
*G01R 33/02*    (2006.01)
*G01V 3/10*    (2006.01)
*G01R 1/00*    (2006.01)

(52) U.S. Cl.
CPC ............... *G01V 3/107* (2013.01); *G01R 1/00* (2013.01); *H05K 999/00* (2013.01); *H05K 2201/00* (2013.01)

(58) Field of Classification Search
CPC ........ G01R 1/00; H05K 1/00; H05K 2201/00; H05K 999/00; G01D 1/00; G05F 1/00; H01F 1/00
See application file for complete search history.

(56) References Cited

U.S. PATENT DOCUMENTS

| | | | | |
|---|---|---|---|---|
| 5,113,136 | A | * | 5/1992 | Hayashi ............... G01R 33/025 324/225 |
| 5,307,072 | A | * | 4/1994 | Jones, Jr. ....................... 342/147 |
| 5,557,206 | A | * | 9/1996 | Won .............................. 324/329 |
| 5,592,939 | A | * | 1/1997 | Martinelli ..................... 600/424 |

(Continued)

FOREIGN PATENT DOCUMENTS

| | | |
|---|---|---|
| CN | 101031823 A | 9/2007 |
| CN | 101535843 A | 9/2009 |

(Continued)

OTHER PUBLICATIONS

International Search Report corresponding to PCT Application No. PCT/EP2012/068720, mailed Jun. 6, 2013 (German and English language document) (5 pages).

(Continued)

*Primary Examiner* — Jermele M Hollington
*Assistant Examiner* — Temilade Rhodes-Vivour
(74) *Attorney, Agent, or Firm* — Maginot, Moore & Beck LLP

(57) ABSTRACT

A metal sensor includes a primary coil, a compensation coil, a first additional coil, and a magnetic field sensor. The first additional coil is configured to be excited without the primary coil and the compensation coil being excited.

12 Claims, 2 Drawing Sheets

(56) References Cited

U.S. PATENT DOCUMENTS

| | | | |
|---|---|---|---|
| 8,476,896 B2* | 7/2013 | Mednikov | 324/202 |
| 2008/0074109 A1 | 3/2008 | Tsukada et al. | |
| 2008/0297158 A1 | 12/2008 | Heger et al. | |
| 2008/0309330 A1* | 12/2008 | Ohyu | A61B 5/05 324/232 |
| 2009/0001982 A1* | 1/2009 | Ausserlechner | G01R 33/1215 324/252 |
| 2010/0308811 A1* | 12/2010 | Wallauer | G01R 33/0029 324/225 |
| 2010/0321014 A1* | 12/2010 | Butzmann | 324/252 |
| 2011/0144953 A1* | 6/2011 | Kropp | G05F 7/00 702/194 |
| 2011/0241665 A1* | 10/2011 | Takatsuji | G01R 33/0023 324/253 |
| 2013/0099783 A1* | 4/2013 | Kubik | G01R 33/096 324/252 |
| 2013/0241534 A1* | 9/2013 | Schaerrer | G01R 15/185 324/117 H |

FOREIGN PATENT DOCUMENTS

| | | |
|---|---|---|
| CN | 101680740 A | 3/2010 |
| DE | 10 2004 047 188 A1 | 3/2006 |
| EP | 0 300 974 A1 | 1/1989 |
| EP | 0 371 261 A2 | 6/1990 |
| EP | 2 312 338 A1 | 4/2011 |
| JP | 2003-255053 A | 9/2003 |
| WO | 2012/055641 A2 | 5/2012 |

OTHER PUBLICATIONS

Hegui Fang, "Design of New Intelligent Metal Detector," Instrument Technique and Sensor, Jan. 2006, Shandong Jiaotong University, Department of Information Engineering, pp. 13-15.

Fan Lizhen, et. al., "Intelligent Metal Detector Based on Microcontroller," Inner Mongolia University, vol. 37, No. 2, pp. 185-189.

* cited by examiner

METAL SENSOR

This application is a 35 U.S.C. §371 National Stage Application of PCT/EP2012/068720, filed on Sep. 24, 2012, which claims the benefit of priority to Serial No. DE 10 2011 086 773.2, filed on Nov. 22, 2011 in Germany, the disclosures of which are incorporated herein by reference in their entirety.

BACKGROUND

The disclosure relates to a metal sensor and to a method for operating a metal sensor.

Metal sensors for discovering metallic or otherwise magnetizable objects in walls, floors or in the ground are known from the prior art and make use of coils to excite magnetic fields and to measure changes in the magnetic flux. Objects are identified by the fact that the measured changes in flux differ depending on whether a magnetizable object is present or not. The measured change in flux is partially a direct result of the exciting magnetic field and partially the result of the magnetic field emanating from the magnetizable object. In general, the magnetic field emanating from the object is in turn a result of the exciting magnetic field.

A metal sensor is known from the unpublished patent application with the applicant's internal file reference R.335154, which metal sensor comprises two coils which are provided to generate two magnetic fields which are oriented in a mutually opposing manner and the overlap of which almost disappears at the location of a magnetic-field sensor of the metal sensor. As a result, when a magnetizable object is not present, the magnetic-field sensor of the metal sensor detects a zero signal, resulting in an advantageous signal-to-noise ratio and high dynamic response. The zero signal is additionally independent of an ambient temperature. However, if a magnetizable object is present, the measurement signal of the magnetic-field sensor deviates from a zero signal and, in general, is not temperature-independent.

SUMMARY

Therefore, the object of the present disclosure is to provide an improved metal sensor with reduced or no temperature dependence. This object is achieved by means of a metal sensor having the features of the disclosure. It is also an object of the present disclosure to specify a method for operating the improved metal sensor. This object is achieved by means of a method having the features of the disclosure. Preferred developments are specified in the dependent claims.

A metal sensor according to the disclosure comprises a primary coil, a compensation coil, a first further coil and a magnetic-field sensor. In this case, the first further coil can be energized without the primary coil and the compensation coil being energized. Advantageously, in the case of said metal sensor, the size of a magnetic field generated only by the first further coil can be measured by means of the magnetic-field sensor. From this, a temperature dependence of the metal sensor can advantageously be determined.

In a preferred embodiment of the metal sensor, said metal sensor comprises a second further coil which can be energized without the primary coil and the compensation coil being energized. In this case, the second further coil is provided to generate a magnetic field which is oriented antiparallel to a magnetic field generatable by the first further coil. The magnetic field generated by the second further coil is expediently of the same strength as the magnetic field generated by the first further coil. Advantageously, the antiparallel magnetic fields generated by the first further coil and the second further coil then overlap, as a result of which the dipole moments thereof cancel out, which leads to the far-field of the two further coils having, in leading order, a quadrupole nature. Consequently, the strength of the magnetic field generated by the further coils decreases sharply with distance, as a result of which any interaction of said magnetic field with metallic or magnetizable objects which may be present is excluded.

In an embodiment of the metal sensor, said metal sensor comprises a disk-shaped circuit carrier. In this case, the primary coil, the compensation coil and the first further coil are arranged on a first surface of the circuit carrier, while the second further coil is arranged on a second surface of the circuit carrier. If the disk-shaped circuit carrier is a multi-layer circuit carrier, then the coils can also be arranged on internal layers. Advantageously, the magnetic-field sensor can then be arranged such that the magnetic fields generated by the first further coil and the second further coil do not completely cancel out at the location of the magnetic-field sensor.

It is expedient that a magnetic field generated in the case of simultaneous energization of the primary coil, the compensation coil, the first further coil and the second further coil disappears at the location of the magnetic-field sensor. Advantageously, the magnetic-field sensor then generates a zero signal when a magnetizable object is not present in the vicinity of the metal sensor, which causes temperature independence, a good signal-to-noise ratio and a high dynamic response.

In an embodiment of the metal sensor, the primary coil, the compensation coil and the first further coil are connected in series. This advantageously ensures that always precisely the same amount of current flows through the primary coil, the compensation coil and the first further coil.

In an embodiment of the metal sensor, the primary coil and the compensation coil can be short-circuited in order to energize the first further coil without the primary coil and the compensation coil being energized. This advantageously makes possible a series arrangement of the primary coil, the compensation coil and the first further coil and still permits individual energization of only the first further coil. However, in an alternative embodiment, the primary coil and the compensation coil can be disconnected instead of being short-circuited.

In a development of the metal sensor, a resistance component is connected in series with the primary coil, the compensation coil and the first further coil, wherein an electrical resistance of the resistance component approximately corresponds to the internal resistance of the series circuit composed of primary coil and compensation coil. In this case, the resistance component can be short-circuited. Advantageously, the resistance component can then be connected into the series circuit if the primary coil and the compensation coil are removed from the series circuit by short-circuiting. The electrical resistance of the series circuit then advantageously remains approximately constant, as a result of which a current flowing through the series circuit also remains constant, as a result of which a change in temperature caused by increasing or decreasing current flow is avoided.

In an additional development of the metal sensor, said metal sensor has a device for measuring an electric current flowing through the coils. A measurement of the current flowing through the coils advantageously permits compensation of a temperature dependence of the current flowing through the coils.

A method according to the disclosure for operating a metal sensor of the type mentioned above comprises the steps of energizing the first further coil without the primary coil and the compensation coil being energized, and measuring a first output voltage of the magnetic-field sensor, of energizing the first further coil without the primary coil and the compensation coil being energized, and measuring a second output voltage of the magnetic-field sensor, of energizing the primary coil, the compensation coil and the first further coil and measuring a third output voltage of the magnetic-field sensor, and of multiplying the third output voltage by a quotient formed from the first output voltage and the second output voltage in order to obtain a corrected third output voltage. This method advantageously allows precise elimination of a temperature dependence of the magnetic-field sensor of the metal sensor. In addition, the method also allows elimination of a temperature dependence of a current flowing through the coils if an inductance of the coils can be ignored and a short circuit of the primary coil and the compensation coil does not lead to significant heating of the further coils and thus to a change in the ohmic resistances of said coils.

In a development of the method, the first output voltage is measured at a defined first temperature, the second output voltage is measured at a second temperature, and the third output voltage is measured at the second temperature.

In a development of the method, the first output voltage is measured at a defined first temperature, the second output voltage is measured at a second temperature, a first current flowing through the first further coil also being measured at the second temperature in the second step, the third output voltage is measured at the second temperature, a second current flowing through the first further coil also being measured at the second temperature in the third step, and the corrected third output voltage is multiplied by a quotient formed from the first current and the second current in order to obtain a fourth output voltage. Advantageously, in this development, the method also allows a compensation of a temperature dependence of the coil currents in the event that the inductances of the coils cannot be ignored.

BRIEF DESCRIPTION OF THE DRAWINGS

The disclosure will now be explained in more detail with reference to the appended figures, in which.

DETAILED DESCRIPTION

Figure 1:
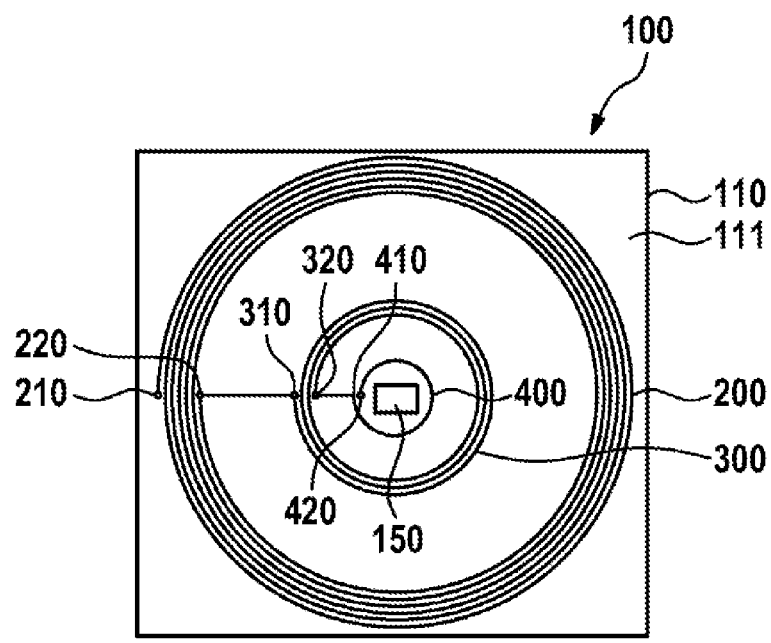
FIG. 1 shows a top view of an upper side of a circuit carrier of a metal sensor.

FIG. 1 shows a section of a metal sensor 100. The metal sensor 100 is used to discover metallic or otherwise magnetizable objects which are concealed in a wall, a floor or in the ground. The magnetizable object can be, for example, 10 cm or 20 cm away from the metal sensor 100.

FIG. 1 shows a top view of an upper side 111 of a circuit carrier 110 of the metal sensor 100. The circuit carrier 110 is designed as a flat disk-shaped layer and can be, for example, a printed circuit board. The structures arranged on the upper side 111 of the circuit carrier 110 can have been printed on, for example.

A primary coil 200, a compensation coil 300 and a first further coil 400 are arranged on the upper side 111 of the circuit carrier 110. The coils 200, 300, 400 are in each case designed to be circular and arranged concentrically with respect to one another. The primary coil 200 has a larger radius than the compensation coil 300. The compensation coil 300 has a larger radius than the first further coil 400. The numbers of turns of the coils 200, 300, 400 illustrated in FIG. 1 have been chosen merely by way of example. The coils 200, 300, 400 can also have more or fewer turns than illustrated in FIG. 1.

The coils can also have a different shape (for example rectangular) and do not need to be arranged concentrically. The shape and arrangement must ensure that, in the case where there is no object, the magnetic field of the primary coil, the compensation coil and the further coils disappears at the location of the magnetic-field sensor and that the magnetic field of the further coils does not disappear at the location of the magnetic-field sensor.

The primary coil 200 has, at the outer end thereof, a first contact 210 and, at the inner end thereof, a second contact 220. The compensation coil 300 has, at the outer end thereof, a first contact 310 and, at the inner end thereof, a second contact 320. The first further coil 400 has, at the outer end thereof, a first contact 410 and, at the inner end thereof, a second contact 420. The second contact 220 of the primary coil 200 is electrically conductively connected to the first contact 310 of the compensation coil 300. The second contact 320 of the compensation coil 300 is electrically conductively connected to the first contact 410 of the first further coil 400.

Figure 2:
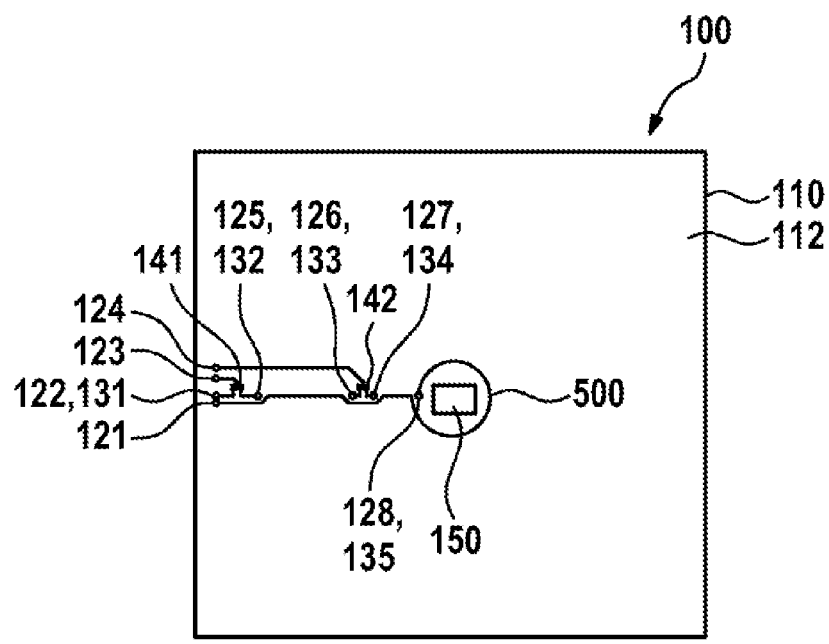
FIG. 2 shows a view through to a lower side of the circuit carrier.

FIG. 2 shows a view through the circuit carrier 110, in which structures of the circuit carrier 110 which are arranged on a lower side 112 opposite the upper side 111 are visible.

The lower side 112 of the circuit carrier 110 has a second further coil 500, which has the same diameter and the same number of turns as the first further coil 400. In addition, the lower side 112 of the circuit carrier 110 has a first connection 121, a second connection 122, a third connection 123 and a fourth connection 124. The connections 121, 122, 123, 124 are externally accessible connections of the circuit carrier 110 and can be electrically conductively connected to other components of the metal sensor 100. The lower side 112 of the circuit carrier 110 also has a fifth connection 125, a sixth connection 126, a seventh connection 127 and an eighth connection 128. The eighth connection 128 is electrically conductively connected to an inner end of the second further coil 500. An outer end of the second further coil 500 is electrically conductively connected to the first connection 121.

In addition, the circuit carrier 110 has a first plated-through hole 131 which electrically conductively connects the second connection 122 to the first contact 210 of the primary coil 200. The first plated-through hole 131 is, like all of the other plated-through holes of the circuit carrier 110, designed as an electrically conductive plated-through hole (via) running through the circuit carrier 110. A second plated-through hole 132 electrically conductively connects the fifth connection 125 to the second contact 220 of the primary coil 200. A third plated-through hole 133 electrically conductively connects the sixth connection 126 to the first contact 310 of the compensation coil 300. A fourth plated-through hole 134 electrically conductively connects the seventh connection 127 to the second contact 320 of the compensation coil 300. A fifth plated-through hole 135 electrically conductively connects the eighth connection 128 to the second contact 420 of the first further coil 400.

The lower side 112 of the circuit carrier 110 also has a first switch 141 and a second switch 142. The switches 141, 142 can be designed as field-effect transistors, for example. A first contact of the first switch 141 is conductively connected to the second connection 122. A second contact of the first switch 141 is electrically conductively connected to the fifth connection 125. A control contact of the first switch 141 is electrically conductively connected to the third connection 123. The first switch 141 is designed to conductively connect to one another, or to isolate from one another, the second connection 122 and the fifth connection 125 on the basis of a control signal present at the third connection 123. A first contact of the second switch 142 is electrically conductively connected to the sixth connection 126. A second contact of the second switch 142 is electrically conductively connected to the seventh connection 127. A control contact of the second switch 142 is electrically conductively connected to the fourth connection 124. The second switch 142 is designed to electrically conductively connect to one another or to isolate from one another, the sixth connection 126 and the seventh connection 127 on the basis of a control signal present at the fourth connection 124.

The circuit carrier 110 also has a magnetic-field sensor 150 which is arranged in the center of the coils 200, 300, 400, 500 in the illustrated example. The magnetic-field sensor 150 can be arranged, for example, in a cutout or an opening in the circuit carrier 110. The magnetic-field sensor 150 is preferably designed as a magnetoresistive magnetic-field sensor but can also be another type of magnetic-field sensor. The magnetic-field sensor 150 is provided to detect a magnitude of a magnetic field prevailing at the location of the magnetic-field sensor 150. The magnetic-field sensor 150 is designed to output an electric voltage amplitude which describes the measurement signal of the magnetic-field sensor 150 in terms of amplitude and phase.

The metal sensor 100 can be operated in two different modes. In this case, an operating voltage is always applied between the first connection 121 and the second connection 122. If the switches 141, 142 are open, that is to say non-conducting, a current flows from the second connection 122 through the first plated-through hole 131 to the first contact 210 of the primary coil 200, through the primary coil 200 to the second contact 220 of the primary coil 200, on to the first contact 310 of the compensation coil 300 through the compensation coil 300 to the second contact 320 of the compensation coil 300, on to the first contact 410 of the first further coil 400, through the first further coil 400 to the second contact 420 of the first further coil 400, through the fifth plated-through hole 135 to the eighth connection 128, on through the second further coil 500 and finally to the first connection 121. In this case, precisely the same current flows through all of the coils 200, 300, 400, 500. In the illustrated example, the flow passes through the primary coil 200 and the second further coil 500 in the clockwise direction, while it passes through the compensation coil 300 and the first further coil 400 in the counterclockwise direction. Thus, the primary coil 200 and the compensation coil 300 generate magnetic fields which are oriented antiparallel. Correspondingly, the first further coil 400 and the second further coil 500 also generate magnetic fields which are oriented antiparallel.

If the switches 141, 142 are closed, that is to say electrically conducting, the primary coil 200 and the compensation coil 300 are electrically short-circuited and bridged as a result. Electric current then flows proceeding from the second connection 122 through the first switch 141 to the fifth connection 125, through the second plated-through hole 132 to the second contact 220 of the primary coil 200, on to the first contact 310 of the compensation coil 300, through the third plated-through hole 133 to the sixth connection 126, via the second switch 142 to the seventh connection 127, through the fourth plated-through hole 134 to the second contact 320 of the compensation coil 300, on to the first contact 410 of the first further coil 400, through the first further coil 400 to the second contact 420 of the first further coil 400, through the fifth plated-through hole 135 to the eighth connection 128, through the second further coil 500 and finally to the first connection 121. In this case the flow passes through the first further coil 400 in the counterclockwise direction, while it passes through the second further coil 500 in the clockwise direction. Thus, the first further coil 400 and the second further coil 500 generate magnetic fields which are oriented antiparallel.

In an alternative embodiment—not illustrated—of the metal sensor 100, the circuit carrier 110 can have an additional resistance component which can be introduced into the series circuit composed of primary coil 200, compensation coil 300, first further coil 400 and second further coil 500 by means of a switch. In this case, the resistance component has an electrical resistance which approximately corresponds to the internal resistance of the series circuit composed of primary coil 200 and compensation coil 300. If the primary coil 200 and the compensation coil 300—as described—are removed from the series circuit by closing of the switches 141, 142, then the resistance component is inserted into the series circuit in order to keep constant the total resistance of the series circuit. If the switches 141, 142 are open and the primary coil 200 and the compensation coil 300 are therefore added to the series circuit, then the resistance component is removed from the series circuit. Instead of a simple ohmic resistance, a complex impedance can also be used as resistance component.

Figure 3:
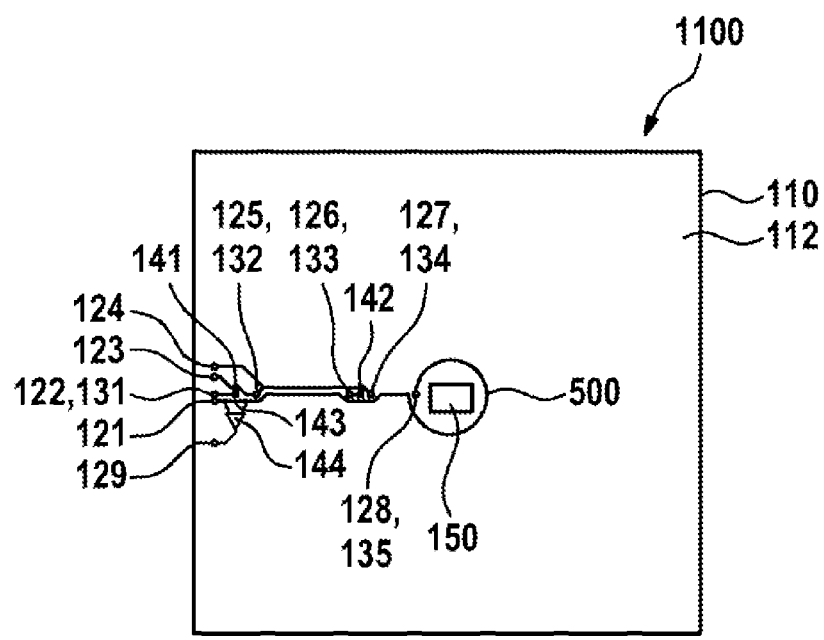
FIG. 3 shows a view through to a lower side of a circuit carrier of a metal sensor of an alternative embodiment.

In a transparent view, FIG. 3 shows the lower side 112 of the circuit carrier 110 of a metal sensor 1100 according to another alternative embodiment. Elements of the metal sensor 1100 which correspond to those of the metal sensor 100 of FIGS. 1 and 2 are provided with the same reference signs. The circuit carrier 110 of the metal sensor 1100 has an additional, ninth connection 129 which can be connected to other components of the metal sensor 1100. In addition, a measuring resistor (shunt) 143 is arranged between the first connection 121 and the second further coil 500. An electric voltage drop across the measuring resistor 143 can be measured by means of a voltmeter 144. The measured result can be read at the ninth connection 129. The voltmeter 144 can be designed, for example, as a differential amplifier. The measuring resistor 143 and the voltmeter 144 are used to quantify an electric current flowing through the coils 200, 300, 400, 500.

The winding directions of the first further coil 400 and the second further coil 500 are selected such that antiparallel magnetic fields are generated. Owing to the low numbers of turns of the first further coil 400 and the second further coil 500, the magnetic field excited by the further coils 400, 500 is small in comparison with the magnetic fields generated by primary coil 200 and compensation coil 300. Matching numbers of turns and diameters of the two further coils lead to identical magnetic field strengths of the magnetic fields generated by the two further coils. The small diameters of the further coils 400, 500 cause a low magnetic field strength over a large distance. The antiparallel orientation of the two magnetic fields of identical strength leads to the dipole moments being canceled out, with the result that the far-field of the further coils 400, 500 has, in leading order, a quadrupole nature and therefore decreases rapidly with increasing distance.

The magnetic-field sensor 150 is not arranged exactly in the middle between the first further coil 400 and the second further coil 500. Consequently, the magnetic fields generated by the further coils 400, 500 do not sum to precisely zero at the location of the magnetic-field sensor 150, rather a small residual field remains. The primary coil 200 and the compensation coil 300 are adapted such that said small residual field is canceled out as soon as all coils 200, 300, 400, 500 are energized. In the absence of a magnetizable object in the vicinity of the metal sensor 100, the magnetic-field sensor 150 then measures a zero signal. If the primary coil 200 and the compensation coil 300 are short-circuited by means of the switches 141, 142, then the small residual field is present again at the magnetic-field sensor 150.

Owing to the rapid decay of the magnetic field generated by the further coils 400, 500 with the distance from the metal sensor 100, the magnitude of the residual field at the location of the magnetic-field sensor 150 is independent of the presence of a magnetizable object in the vicinity of the metal sensor 100. However, the magnitude of the residual field can be temperature-dependent and can therefore be used to determine and compensate for a temperature dependence of the metal sensor 100. Such a temperature dependence can result, for example, from a temperature dependence of the amplitude of a measurement signal supplied by the magnetic-field sensor 150 and from a temperature dependence of the magnetic field generated by the primary coil 200, which latter temperature dependence in turn is brought about by a temperature dependence of the internal resistance of the primary coil 200 and, as a result, by a temperature dependence of the electric current flowing through the coils 200, 300, 400, 500.

Figure 4:
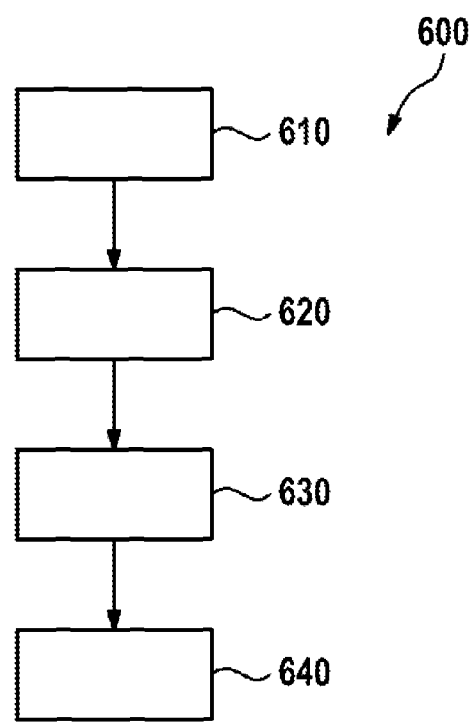
FIG. 4 shows a schematic flow chart of a method for operating a metal sensor.

FIG. 4 shows a schematic flow chart of a method 600 for compensating for a temperature dependence of the metal sensor 100. The method 600 can be used if the inductance of the coils 200, 300, 400, 500 can be ignored and the short-circuit of primary coil 200 and compensation coil 300 does not lead to significant intrinsic heating of the further coils 400, 500 and therefore to a change in the electrical resistances of the further coils 400, 500.

In a first method step 610, during a factory calibration of the metal sensor 100, the first further coil 400 and the second further coil 500 are energized, without the primary coil 200 and the compensation coil 300 being energized. The primary coil 200 and the compensation coil 300 are thus short-circuited by the switches 141, 142. Next, a first output voltage U1 of the magnetic-field sensor 150 is measured. The measured value U1 is, for example, stored in an evaluation circuit of the metal sensor 100.

In a second method step 620, during a conventional application of the metal sensor 100, the first further coil 400 and the second further coil 500 are again energized, without the primary coil 200 and the compensation coil 300 being energized. A second output voltage U2 of the magnetic-field sensor 150 is now measured. Hence, the magnitude of the residual field prevailing at the location of the magnetic-field sensor 150 is determined both in the first method step 610 and in the second method step 620, it being possible for said magnitude to have changed between the two measurements owing to a temperature dependence.

In a third method step 630, the primary coil 200, the compensation coil 300, the first further coil 400 and the second further coil 500 are energized. For this purpose, the first switch 141 and the second switch 142 are therefore opened. A third output voltage U3 of the magnetic-field sensor 150 is now measured. The third output voltage U3 is different from zero if there is a magnetizable object present in the vicinity of the metal sensor 100. However, the third output voltage U3 can be distorted by a temperature dependence of the metal sensor 100.

In a fourth method step 640, said temperature dependence is removed computationally by the third output voltage U3 being multiplied by a quotient formed from the first output voltage U1 and the second output voltage U2 in order to obtain a corrected third output voltage U3':

$$U3' = \frac{U1}{U2}U3.$$

The corrected third output voltage U3' is freed from any temperature dependence under the abovementioned assumptions. In particular, a temperature dependence of the magnetic-field sensor 150 is completely eliminated.

If the inductances of the coils 200, 300, 400, 500 cannot be ignored and/or the current flowing through the coils 400, 500 is also subject to a temperature dependence, an additional temperature compensation is then necessary for the coil currents. This can be performed in a development of the method 600, wherein the metal sensor 1100 from FIG. 3 is used.

In this development of the method, the first output voltage U1 is performed in the first method step 610 during the factory calibration at a defined first temperature T0. In the second method step 620, the second output voltage U2 is measured at a second temperature T which is defined by the temperature prevailing at the time of use of the metal sensor 1100. In addition, in this development, a first current I1 flowing through the further coils 400, 500 is measured at the second temperature T in the second method step 620. By way of example, the measuring resistance 143 and the voltmeter 144 can be used for this purpose. In the third method step 630, the third output voltage U3 is likewise measured at the second temperature T. In addition, in the third method step 630, a second current I2 flowing through the coils 200, 300, 400, 500 is measured at the second temperature.

In the fourth method step 640, the corrected third output voltage U3' is also multiplied by a quotient formed from the first current I1 and the second current I2 in order to obtain a fourth output voltage U3":

$$U3'' = \frac{I1}{I2}U3'\frac{U1}{U2}U3\frac{I1}{I2}.$$

The fourth output voltage U3" is also cleared of any possible temperature dependence of the coil currents, which also applies in the event that the inductances of the coils 200, 300, 400, 500 cannot be ignored. Instead of the first current I1 and the second current I2, voltage drops across the measuring resistance 143 can also be measured. In this case, the corrected third output voltage U3' is multiplied by a quotient formed from the first measured voltage and the second measured voltage in order to obtain the fourth output voltage U3". A possible temperature dependence of the measuring resistance 143 is canceled out here.

In a simplified embodiment, the second further coil 500 can be eliminated. However, this has the disadvantage that the magnetic field generated by the first further coil 400 then has, in leading order, a dipole nature and thus decreases less rapidly with increasing distance from the metal sensor 100, 1100.

The further coils 400, 500 could also have additional turns in the same sense or additional turns in opposite senses. In this case, the residual field measurable at the location of the magnetic-field sensor 150 would be larger or smaller.

Additional further coils could also be provided in order to cause the magnetic field generated by the further coils not to have, in leading multipole order, a quadrupole nature, but an octupole nature, for example. In this case, the distance dependence of the magnetic field generated by the further coils would be even more advantageous.

It would also be possible to disconnect the further coils 400, 500 if the primary coil 200 and the compensation coil 300 were operational. However, this would have the disadvantage that the further coils 400, 500 would not warm up constantly, which could cause a distortion of the result.

Instead of short-circuiting the primary coil 200 and the compensation coil 300 by means of the switches 141, 142, the primary coil 200 and the compensation coil 300 could also be disconnected in order to energize only the further coils 400, 500.

The invention claimed is:

1. A metal sensor, comprising:
a primary coil;
a compensation coil;
a first further coil; and
a magnetic-field sensor,
wherein the first further coil is configured to be energized without the primary coil and the compensation coil being energized, and
further comprising a second further coil configured to be energized without the primary coil and the compensation coil being energized, the second further coil being further configured to generate a magnetic field that is oriented antiparallel to a magnetic field generatable by the first further coil.

2. The metal sensor as claimed in claim 1, further comprising a disk-shaped circuit carrier,
wherein the primary coil, the compensation coil, and the first further coil are arranged on a first surface of the circuit carrier, and
wherein the second further coil is arranged on a second surface of the circuit carrier.

3. The metal sensor as claimed in claim 1, further comprising a multilayer disk-shaped circuit carrier,
wherein the primary coil, the compensation coil, and the first further coil are arranged on a first surface or internal layer of the circuit carrier, and
wherein the second further coil is arranged on a second surface or internal layer of the circuit carrier.

4. The metal sensor as claimed in claim 1, wherein a magnetic field generated in the case of simultaneous energization of the primary coil and the compensation coil disappears at the location of the magnetic-field sensor.

5. The metal sensor as claimed in claim 1, wherein a magnetic field generated in the case of simultaneous energization of the primary coil, the compensation coil, the first further coil, and the second further coil disappears at the location of the magnetic-field sensor.

6. The metal sensor as claimed in claim 1, wherein the primary coil, the compensation coil, and the first further coil are connected in series.

7. The metal sensor as claimed in claim 6, wherein the primary coil and the compensation coil are configured to be short-circuited so as to energize the first further coil without the primary coil and the compensation coil being energized.

8. The metal sensor as claimed in claim 7, further comprising a resistance component connected in series with the primary coil, the compensation coil, and the first further coil,
wherein an electrical resistance of the resistance component approximately corresponds to the internal resistance of the series circuit composed of the primary coil and the compensation coil, and
wherein the resistance component is configured to be short-circuited.

9. The metal sensor as claimed in claim 1, wherein the metal sensor has a device configured to measure an electric current flowing through the coils.

10. A method for operating a metal sensor including a primary coil, a compensation coil, a first further coil, and a magnetic-field sensor, the first further coil being configured to be energized without the primary coil and the compensation coil being energized, the method comprising:
energizing the first further coil without the primary coil and the compensation coil being energized, and measuring a first output voltage of the magnetic-field sensor;
energizing the first further coil without the primary coil and the compensation coil being energized, and measuring a second output voltage of the magnetic-field sensor;
energizing the primary coil, the compensation coil, and the first further coil and measuring a third output voltage of the magnetic-field sensor; and
multiplying the third output voltage by a quotient formed from the first output voltage and the second output voltage so as to obtain a corrected third output voltage.

11. The method as claimed in claim 10, wherein:
the first output voltage is measured at a defined first temperature,
the second output voltage is measured at a second temperature,
a first current flowing through the first further coil is also measured at the second temperature,
the third output voltage is measured at the second temperature,
a second current flowing through the first further coil is also measured at the second temperature, and
the corrected third output voltage is multiplied by a quotient formed from the first current and the second current so as to obtain a fourth output voltage.

12. A metal sensor, comprising:
a primary coil;
a compensation coil;
a first further coil; and
a magnetic-field sensor,
wherein the first further coil is configured to be energized without the primary coil and the compensation coil being energized,
wherein the primary coil, the compensation coil, and the first further coil are connected in series, and
wherein the primary coil and the compensation coil are configured to be short-circuited so as to energize the first further coil without the primary coil and the compensation coil being energized, and
further comprising a second further coil configured to be energized without the primary coil and the compensation coil being energized, the second further coil being further configured to generate a magnetic field that is oriented antiparallel to a magnetic field generatable by the first further coil.

\* \* \* \* \*

UNITED STATES PATENT AND TRADEMARK OFFICE
CERTIFICATE OF CORRECTION

PATENT NO. : 9,638,825 B2
APPLICATION NO. : 14/359600
DATED : May 2, 2017
INVENTOR(S) : Hahl et al.

Page 1 of 1

It is certified that error appears in the above-identified patent and that said Letters Patent is hereby corrected as shown below:

On the Title Page

In Item (72), Inventor #1, Markus Hahl's residence should read:
"Korntal-Muenchingen (DE)"

Signed and Sealed this
First Day of August, 2017

Joseph Matal
*Performing the Functions and Duties of the*
*Under Secretary of Commerce for Intellectual Property and*
*Director of the United States Patent and Trademark Office*